(12) United States Patent
Kim et al.

(10) Patent No.: US 8,895,955 B2
(45) Date of Patent: Nov. 25, 2014

(54) DISPLAY APPARATUS USING OXIDE DIODE (75) Inventors: Kyoungkook Kim, Suwon-si (KR);
Youngsoo Park, Yongin-si (KR);
Jaechul Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1184 days.

(21) Appl. No.: 12/285,448

(22) Filed: Oct. 6, 2008

(65) Prior Publication Data

US 2009/0321738 A1 Dec. 31, 2009

(30) Foreign Application Priority Data

Jun. 25, 2008 (KR) .................. 10-2008-0060228

(51) Int. Cl.
*H01L 29/06* (2006.01)
*B82Y 10/00* (2011.01)
*H01L 33/18* (2010.01)
*H01L 29/786* (2006.01)
*H01L 27/12* (2006.01)
*H01L 33/28* (2010.01)

(52) U.S. Cl.
CPC ............. *H01L 29/0665* (2013.01); *H01L 33/18* (2013.01); *H01L 29/7869* (2013.01); *B82Y 10/00* (2013.01); *H01L 27/1214* (2013.01); *H01L 33/28* (2013.01); *H01L 29/0676* (2013.01); *H01L 29/0673* (2013.01)
USPC ................. 257/13; 257/103; 257/79; 257/84; 257/94; 257/98; 257/99

(58) Field of Classification Search
USPC ............... 257/40, 103, 79, 84, 94, 98, 99, 13; 438/99, 149; 977/730
See application file for complete search history.

(56) References Cited

U.S. PATENT DOCUMENTS

| 5,686,734 | A  | * | 11/1997 | Hamakawa et al. | ............ 257/16 |
| 7,268,370 | B2 | * | 9/2007  | Ueda            | ............... 257/84 |
| 7,623,101 | B2 | * | 11/2009 | Hayashi et al.  | .................. 345/82 |
| 2001/0003016 | A1 | * | 6/2001 | Pan et al.      | ....................... 427/569 |

(Continued)

FOREIGN PATENT DOCUMENTS

| KR | 2006-0029418 A | 4/2006 |
| KR | 2006-0121413 A | 11/2006 |
| KR | 2006-0121422 A | 11/2006 |
| KR | 2008-0001049 A | 1/2008 |

OTHER PUBLICATIONS

Q. Hong et al.; "Growth of ZnO Nanorods on GaN using aqueous solution method"; Applied Physics Letters, vol. 87, Issue 10; 2009.

(Continued)

*Primary Examiner* — Zandra Smith
*Assistant Examiner* — Tsz Chiu
(74) *Attorney, Agent, or Firm* — Harness, Dickey & Pierce, P.L.C.

(57) ABSTRACT

Provided may be a display apparatus that uses oxide diodes having a nano rod structure, for example, nano-rod diodes formed of a ZnO group material. The display apparatus may include a substrate, a thin film transistor layer on the substrate, and a light emitting layer on the thin film transistor layer, wherein the light emitting layer may include a plug metal layer on the thin film transistor layer, a plurality of nano-rod diodes vertically formed on the plug metal layer, and a transparent electrode on the nano-rod diodes.

15 Claims, 4 Drawing Sheets

(56) References Cited

U.S. PATENT DOCUMENTS

| | | | |
|---|---|---|---|
| 2004/0252867 A1* | 12/2004 | Lan et al. | 382/124 |
| 2006/0049419 A1* | 3/2006 | Tanaka et al. | 257/98 |
| 2006/0189018 A1 | 8/2006 | Yi et al. | |
| 2007/0041214 A1* | 2/2007 | Ha et al. | 362/612 |
| 2007/0117257 A1* | 5/2007 | Kim et al. | 438/99 |
| 2007/0158661 A1 | 7/2007 | Lu et al. | |

OTHER PUBLICATIONS

S. Yoon et al.; "Highly efficient transparent organic light-emitting diodes by ion beam assisted deposition-prepared indium tin oxide cathode"; Applied Physics Letters, vol. 90, pp. 033513-1 to 033513-3; 2007.

E Spiller; "Reflective multilayer coatings for the far uv region"; Applied Optics, vol. 15, pp. 2333-2338; 1976.

Y.J. Kim et al.; "Controlled selective growth of ZnO nanorod and microrod arrays on Si substrates by a wet chemical method"; Applied Physics Letters, vol. 89, pp. 163128-1 to 163128-3; 2006.

S.Y. Ryu et al.; "Transparent organic light-emitting diodes consisting of a metal oxide multilayer cathode"; Applied Physics Letters, vol. 92, pp. 023306-1 to 023306-3; 2008.

M. Huang et al. "Room-Temperature Ultraviolet Nanowire Nanolasers"; Science, vol. 292, pp. 1897-1899; 2001.

Korean Office Action for corresponding Korean Application No. 2008-0060228 dated Jun. 26, 2014.

* cited by examiner

DISPLAY APPARATUS USING OXIDE DIODE

PRIORITY STATEMENT

This application claims priority under 35 U.S.C. §119 to Korean Patent Application No. 10-2008-0060228, filed on Jun. 25, 2008, in the Korean Intellectual Property Office, the entire contents of which are incorporated herein by reference.

BACKGROUND

1. Field

Example embodiments relate to a display apparatus that uses an oxide diode, and more particularly, to a display apparatus that uses an oxide diode having a nano-rod structure, e.g., a nano-rod structure formed of zinc oxide.

2. Description of the Related Art

Many different kinds of display apparatuses have been developed. One of the representative display apparatus may be a liquid crystal display (LCD). However, in the case of the LCD, in order to display an image on a screen, a backlight unit must be formed on a rear side of a liquid crystal panel, and be in a 'turn ON' state while the display is in operation. Accordingly, the backlight unit continuously consumes power. Thus, an LCD may consume a relatively large amount of power compared to other displays.

Also, in the case of an LCD, there may be a relatively large optical loss of light that may be emitted from the backlight unit in a process of passing through a polarizing plate, a liquid crystal layer, and a color filter. Thus, only a portion of light emitted from the backlight unit may be transmitted to the viewers. For this reason, an amount of light greater than light actually used may be required. In practice, in the case of LCD, light recognized by the viewer's eyes may be about 3% of the initial light emitted from the backlight unit, and the efficiency of light may be relatively low. Due to the relatively low optical efficiency, overall power consumption may be further increased.

As a next generation display apparatus, an organic light emitting diode (OLED) is being studied. Display apparatuses that use the OLED may have a wider viewing angle and a shorter response time. Also, the OLEDs may be formed to be thin, and thus, may be bended. Therefore, the OLEDs may be applied to flexible displays. However, an organic light emitting material used in the OLED may have a limited lifespan due to the characteristics of the organic material. An organic light emitting material that emits blue light having a lifetime of about 15,000 hours may have only a half of the lifetime (about 30,000 hours) required for a conventional flat panel TV.

Also, as yet, OLEDs may have a drawback of low light emission efficiency. In order to be realized as a display, the organic light emitting material must have a brightness of about 250 Cd/m$^2$ when emitting light. The organic light emitting material that emits blue light currently may have an efficiency of about 15 Cd/A. Thus, in order to obtain a desired brightness, a relatively large amount of power consumption may be required.

Furthermore, the OLED must be manufactured in a bottom emitting structure that may have a relatively large optical loss. In the case of the bottom emitting structure, a light emission area may be reduced due to a thin film transistor region formed under the light emission region for controlling a light emission operation of the organic light emitting material, and also, light must pass a thick glass substrate on a bottom of the OLED, and thus, an additional optical loss may be caused. In the case of a top emission type OLED, because light may be emitted through a transparent upper electrode formed right above the organic light emitting material, such optical loss may not be initiated. However, if a transparent electrode is formed on the organic light emitting material, the organic light emitting material may be damaged and may be more easily degraded in the course of forming the transparent electrode.

SUMMARY

To address the above and/or other problems, example embodiments provide a display apparatus that may have a longer lifespan and increased light emission efficiency by using an oxide diode having a nano-rod structure.

According to example embodiments, a display apparatus may include a substrate, a thin film transistor layer on the substrate, and a light emitting layer on the thin film transistor layer, wherein the light emitting layer may include a plug metal layer on the thin film transistor layer, a plurality of nano-rod diodes vertically formed on the plug metal layer, and a transparent electrode on the nano-rod diodes.

Each of the nano-rod diodes may include a lower layer portion doped with a first type dopant, an upper layer portion doped with a second type dopant which may be opposite-to the first type, and a non-doped region between the lower layer portion and the upper layer portion.

The lower layer portion of the nano-rod diode may be formed of an n-type ZnO group material, the upper layer portion of the nano-rod diode may be formed of a p-type ZnO group material, and the non-doped region of the nano-rod diode may be formed of a non-doped ZnO group material.

The display apparatus may further include a reflection layer for reflecting light emitted from the nano-rod diodes on an upper surface of the plug metal layer between the nano-rod diodes. The reflection layer may be formed to a single metal layer. The reflection layer may be formed of Al or an alloy containing Al. The reflection layer may have a multilayer structure in which two materials having different refractive indexes from each other are alternately stacked.

The reflection layer may have a multilayer structure in which Al and MgF$_2$ are alternately stacked. The display apparatus may further include an insulating layer on an upper surface of the reflection layer between the nano-rod diodes. The nano-rod diodes may emit ultraviolet (UV) ray region light. The display apparatus may further include a transparent electrode on the insulating layer, and a phosphor layer on the transparent electrode to transform the UV ray region light emitted from the nano-rod diodes into visible light region light.

The display apparatus may further include a transparent substrate on an upper surface of the phosphor layer. The display apparatus may include a plurality of pixels for displaying an image, and each of the pixels may include three sub-pixels, wherein each of the sub-pixels may include a single thin film transistor layer and a single light emitting layer.

The phosphor layers in the three sub-pixels may be a red phosphor layer that transforms the UV ray region light into red color, a green phosphor layer that transforms the UV ray region light into green color, and a blue phosphor layer that transforms the UV ray region light into blue color. The plug metal layer may be formed of Au or an alloy containing Au.

BRIEF DESCRIPTION OF THE DRAWINGS

Example embodiments will be more clearly understood from the following detailed description taken in conjunction with the accompanying drawings. FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
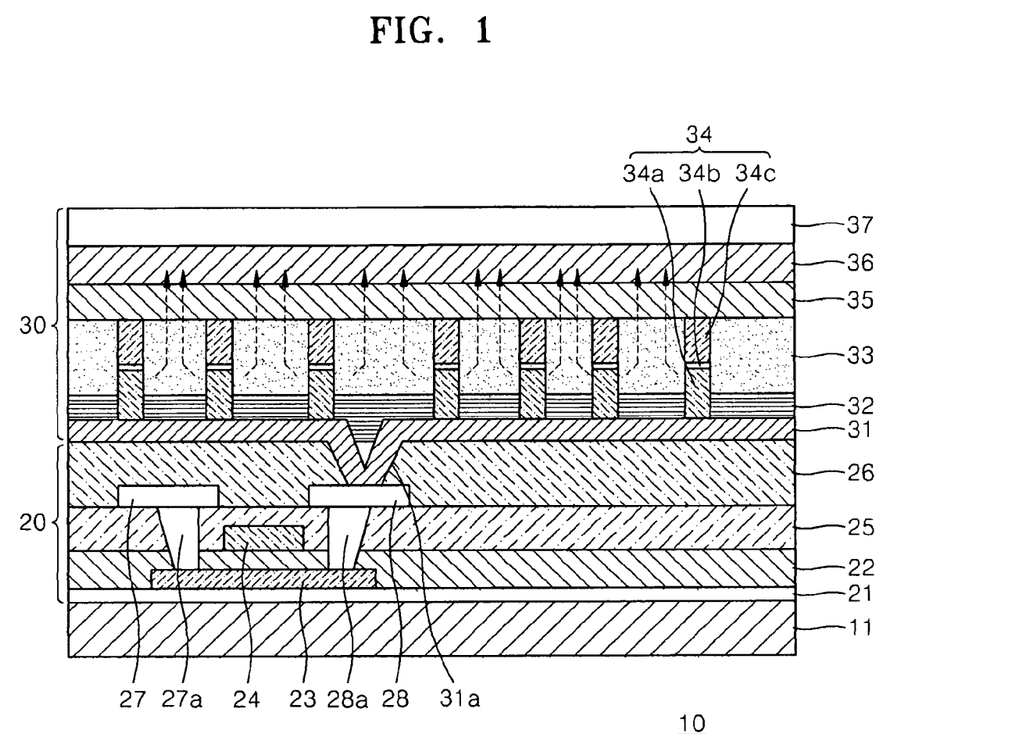
FIG. 1 is a schematic cross-sectional view of a display apparatus that uses an oxide diode according to example embodiments.

FIG. 1 is a schematic cross-sectional view of a display apparatus 10 that uses an oxide diode according to example embodiments. Referring to FIG. 1, the display apparatus 10 may include a thin film transistor layer 20 formed on a substrate 11, e.g., glass, and a light emitting layer 30 having a plurality of diodes 34 having a nano-rod structure.

The thin film transistor layer 20 may be formed to control the emission of light from the light emitting layer 30, for example, the nano-rod diodes 34, and may be a conventional thin film transistor layer used in LCDs or OLEDs. For example, as depicted in FIG. 1, the thin film transistor layer 20 may include a silicon oxide film 21 formed on the substrate 11, a semiconductor layer 23 partly formed on the silicon oxide film 21, a gate insulating layer 22 covering the semiconductor layer 23 and the silicon oxide film 21, a gate electrode 24 formed on the gate insulating layer 22 to face the semiconductor layer 23, a first insulating layer 25 covering the gate electrode 24 and the gate insulating layer 22, a source electrode 27 and a drain electrode 28 formed on the first insulating layer 25, and a second insulating layer 26 formed on the first insulating layer 25 to cover the source electrode 27 and the drain electrode 28.

The silicon oxide film 21 may block various impurities that may penetrate into the semiconductor layer 23 and the gate insulating layer 22 from the glass substrate 11 during a manufacturing process. The semiconductor layer 23 may be formed of polysilicon, amorphous silicon, or various types of oxide semiconductors. The source electrode 27 and the drain electrode 28, which act as bit lines, may be connected to both ends of an upper surface of the semiconductor layer 23 through a first via hole 27a and a second via hole 28a. In the above structure, when current is applied to the gate electrode 24, a current supplied to the source electrode 27 may flow into the drain electrode 28 through the semiconductor layer 23, and may be transmitted to the nano-rod diodes 34 through a plug metal layer 31, which will be described later.

The structure of the light emitting layer 30 formed on the thin film transistor layer 20 will now be described. As depicted in FIG. 1, the light emitting layer 30 may include the plug metal layer 31 formed on the thin film transistor layer 20, e.g., on the second insulating layer 26, a plurality of nano-rod diodes 34 vertically grown on the plug metal layer 31, a transparent electrode 35 formed on the nano-rod diodes 34, a phosphor layer 36 formed on the transparent electrode 35, and a transparent substrate 37 formed on the phosphor layer 36.

Each of the nano-rod diodes 34 may include a lower layer portion 34a doped with an n-type dopant, an upper layer portion 34c doped with a p-type dopant, and a non-doped region 34b between the lower layer portion 34a and the upper layer portion 34c. For example, the nano-rod diodes 34 may be a p-n diode that uses an oxide diode, e.g., a zinc oxide group material. The zinc oxide group material may be, for example, ZnO or MgZnO. In example embodiments, the lower layer portion 34a of the nano-rod diode 34 may be formed of an n-type zinc oxide group material (n-ZnO or n-MgZnO), the upper layer portion 34c of the nano-rod diode 34 may be formed of a p-type zinc oxide material group ((p-ZnO or p-MgZnO), and the non-doped region 34b of the nano-rod diode 34 may be formed of an non-doped zinc oxide group material (i-ZnO or i-MgZnO). In the above structure, light emission may generally occur from the non-doped zinc oxide group material (i-ZnO or i-MgZnO). If the non-doped zinc oxide group material is formed in a nano-rod shape, crystallinity of the material may be improved, and thus, the defect concentration that affects the optical emission efficiency may be reduced. Thus, the zinc oxide diode having a nano-rod structure may increase the efficiency of the display apparatus.

For example, because ZnO has a larger band gap energy of about 3.4 eV, when ZnO is used to formed the nano-rod diode 34, ultraviolet (UV) ray region light having a wavelength of about 410 nm or less may be emitted. The display apparatus 10 according to example embodiments may require the phosphor layer 36 that transforms the UV ray region light emitted from the nano-rod diode 34 to a visible light region. Visible light having a desired color may be obtained according to the type of phosphor layer 36. For example, if the display apparatus 10 according to example embodiments includes red, green, and blue sub-pixels, appropriate phosphor materials for emitting red, green, and blue light may be used as the phosphor layer 36 in each of the sub-pixels.

This configuration may have an advantage in that if different diodes that emit different color are used in each of the sub-pixels, the process for manufacturing the overall light emitting layers may be relatively complicated. However, in example embodiments, the nano-rod diodes 34 in the light emitting layer 30 may be simultaneously formed, and only the phosphor layer 36 in the sub-pixels may be separately printed. Thus, according to example embodiments, the process of manufacturing the light emitting layer 30 may be simplified. However, other materials that emit visible light may also be used to form the nano-rod diodes 34 instead of ZnO group materials.

The plug metal layer 31 may not only act as a growing catalyst substrate for promoting selective growth of the nano-rod diodes 34, but also may act as a lower electrode that transmits signals from the thin film transistor layer 20 to the nano-rod diodes 34. Thus, the plug metal layer 31 may be formed of a material that has increased electrical conductivity and may selectively grow the nano-rod diodes 34. For example, when a ZnO group material is used to form the nano-rod diodes 34, the plug metal layer 31 may be formed of Au or an alloy that contains Au. Because the plug metal layer 31 acts as a lower electrode, the plug metal layer 31 may be connected to the thin film transistor layer 20, for example, the drain electrode 28, through a third via hole 31a that passes through the second insulating layer 26. According to example embodiments, the plug metal layer 31 may be formed on the entire region of the thin film transistor layer 20 to maximize or increase a top-emission characteristic. However, in some cases, due to various process reasons, the plug metal layer 31 may be patterned not to overlap the transistor under the plug metal layer 31.

The transparent electrode 35 may act as an upper electrode of the nano-rod diodes 34, and may be formed of a material having increased electrical conductivity and a higher visible light transmittance. For example, the transparent electrode 35 may be formed of indium tin oxide (ITO), aluminium zinc oxide (AZO), or indium zinc oxide (IZO). These types of transparent electrodes may be annealed at a temperature of, conventionally, about 300° C. or above in order to increase the electrical conductivity. As described above, in the case of an OLED, the characteristic of an organic light emitting material formed under the transparent electrode may be degraded in a process of annealing the transparent electrode. Due to the above drawback, current OLEDs may adopt a bottom emission type. However, in example embodiments, because the diodes are formed using an inorganic material that does not change its characteristics at a higher temperature, e.g., a metal oxide (for example, a ZnO group material), the above transparent electrode 35 may be used as an upper electrode. Thus, example embodiments may employ a top-emission type which has a relatively wide light emission area.

In order to further increase the top-emission characteristic, a reflection layer 32 may further be formed on an upper surface of the plug metal layer 31 between the nano-rod diodes 34. The reflection layer 32 may reflect light emitted from the nano-rod diodes 34 towards the transparent electrode 35. For example, if the nano-rod diodes 34 are formed of a ZnO group material, the reflection layer 32 may be formed to have increased reflectivity with respect to UV ray region light. The reflection layer 32 may be formed in various ways. A simple method may be that the reflection layer 32 may be formed as a single metal layer. In example embodiments, the reflection layer 32 may be formed of, for example, Al or an alloy containing Al. In order to further increase the reflectivity of the reflection layer 32, a multi-layer structure in which two materials having different refractive indexes from each other are alternately stacked may be adopted. For example, the reflection layer 32 may have a multi-layer structure in which Al and $MgF_2$ may be alternately stacked.

Also, a third insulating layer 33 may further be formed on an upper surface of the reflection layer 32 between the nano-rod diodes 34 to prevent or reduce physical and chemical impacts on the nano-rod diodes 34 and the reflection layer 32 and to prevent or reduce an electrical short between the nano-rod diodes 34. The third insulating layer 33 may have transparency with respect to light, and may be a silicon oxide film ($SiO_2$).

Figure 2A:
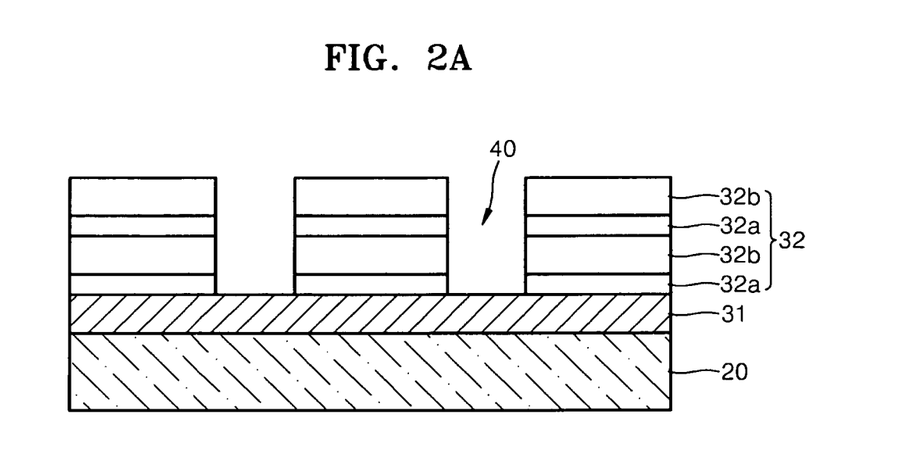
FIGS. 2A through 2E are cross-sectional views illustrating a method of manufacturing a display apparatus that uses an oxide diode according to example embodiments.

FIGS. 2A-2E are cross-sectional views illustrating a method of forming the light emitting layer 30 according to example embodiments on the thin film transistor layer 20. Referring to FIG. 2A, after depositing the plug metal layer 31 on the thin film transistor layer 20, the reflection layer 32 may be formed on the plug metal layer 31. In FIG. 2A, the reflection layer 32, in which an $MgF_2$ layer 32a and an Al 32b are alternately stacked, may be depicted as an example. Afterwards, holes 40, where the nano-rod diodes 34 will be positioned, may be formed in the reflection layer 32 by etching the reflection layer 32. The holes 40 may be formed to expose the plug metal layer 31 under the reflection layer 32.

Figure 2B:
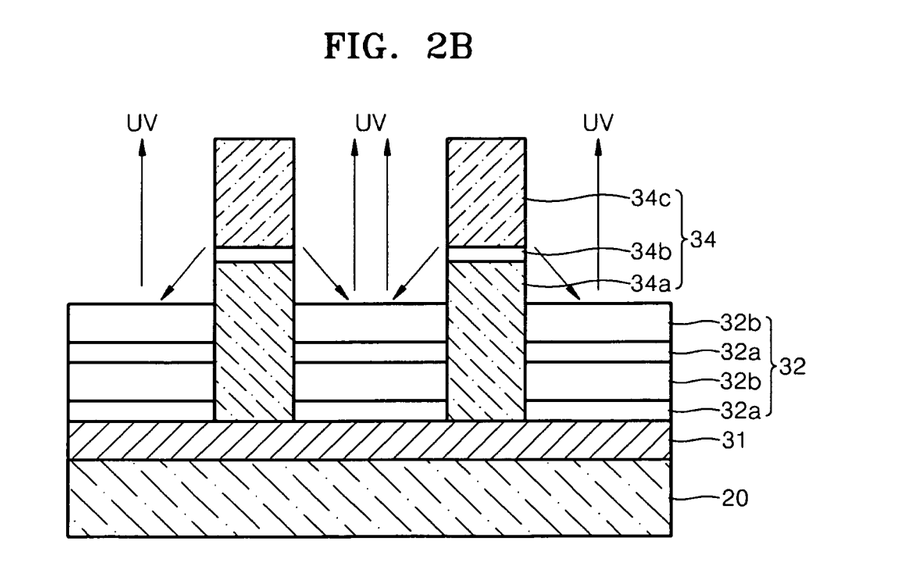

Afterwards, as depicted in FIG. 2B, the nano-rod diodes 34 may be grown in the holes 40. As described above, the plug metal layer 31 may be formed of a catalyst metal that may selectively grow the nano-rod diodes 34 according to the material used to form the nano-rod diodes 34. For example, if the nano-rod diodes 34 are formed of a ZnO group material, the plug metal layer 31 may be formed of Au or an alloy containing Au. Thus, the growth of the nano-rod diodes 34 may be limited in the hole 40 through which the plug metal layer 31 is exposed. Various conventional methods of growing the nano-rod diodes 34 using the ZnO group material may have been reported in the art. According to the conventional method of growing the nano-rod diodes, after growing n-ZnO (or n-MgZnO) 34a, i-ZnO (i-MgZnO) 34b and p-ZnO (or p-MgZnO) 34c may be grown. Because only the reflection layer 32 is formed around the ZnO nano-rod diodes 34, UV ray region light generated during operation of the OLED after the manufacturing is completed may be reflected upwards by the reflection layer 32.

Figure 2C:
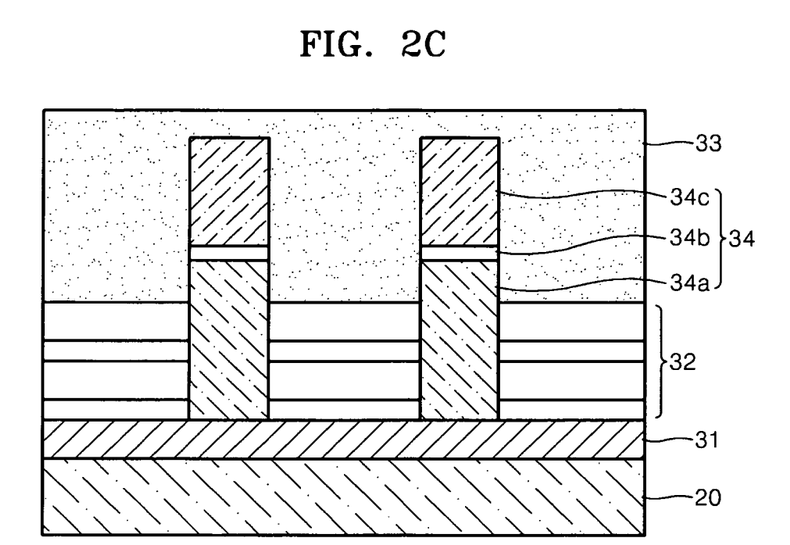
Figure 2D:
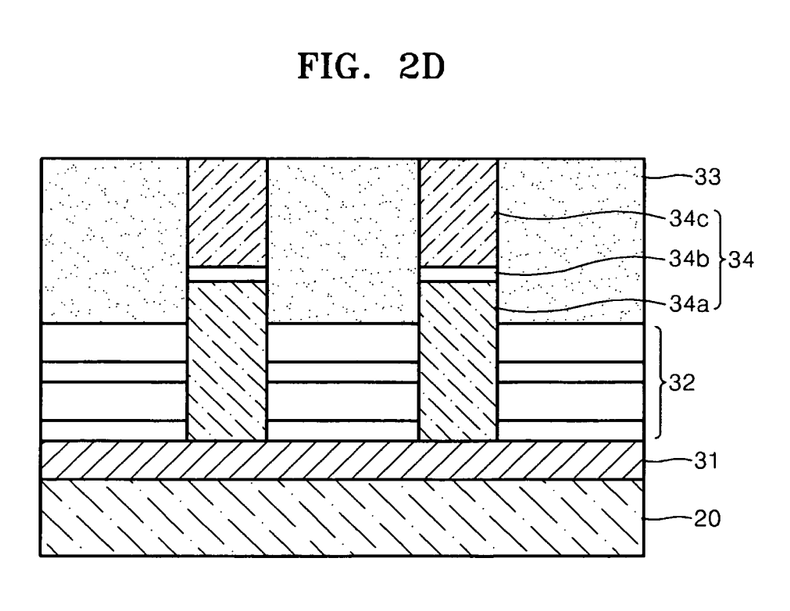

Referring to FIG. 2C, the third insulating layer 33 may cover the nano-rod diodes 34 by forming the third insulating layer 33 on the reflection layer 32. As described above, the third insulating layer 33 may be a transparent silicon oxide ($SiO_2$) film. The third insulating layer 33 may completely cover the nano-rod diodes 34. Accordingly, as depicted in FIG. 2D, upper surfaces of the nano-rod diodes 34 may be exposed by planarizing the third insulating layer 33 using a CMP process or an overall etching process.

Figure 2E:
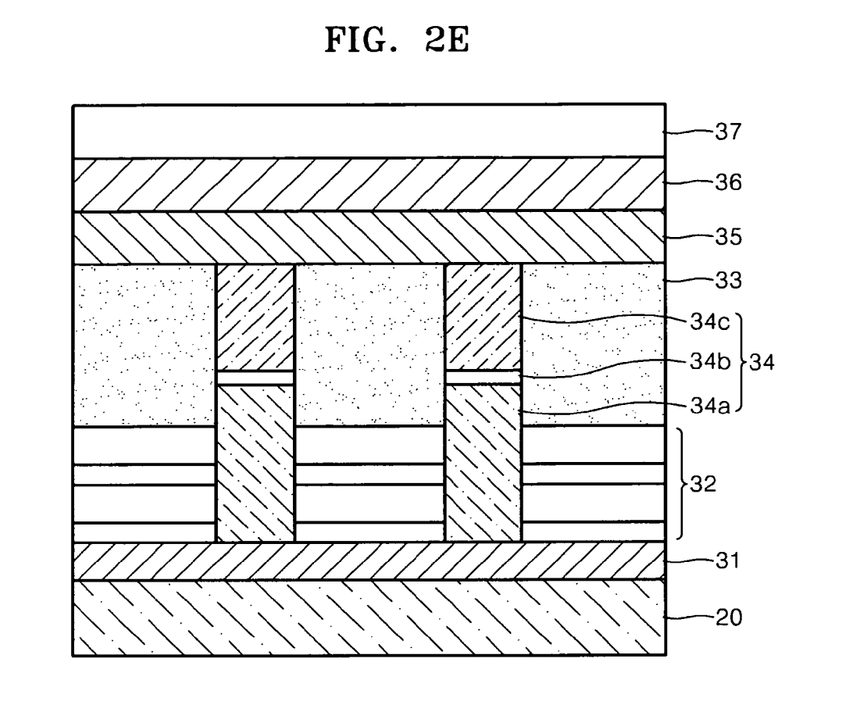

Referring to FIG. 2E, the transparent electrode 35 as an upper electrode may be deposited on the third insulating layer 33 and the nano-rod diodes 34, and the transparent electrode 35 may be patterned. Afterwards, the transparent electrode 35 may be annealed using a conventional annealing method in order to increase the electrical conductivity of the transparent electrode 35. The phosphor layer 36 may be printed on the transparent electrode 35, and a transparent substrate may further be formed on the phosphor layer 36. Alternatively, the transparent substrate 37, on which the phosphor layer 36 is printed in advance, may be disposed on the transparent electrode 35.

Figure 3:
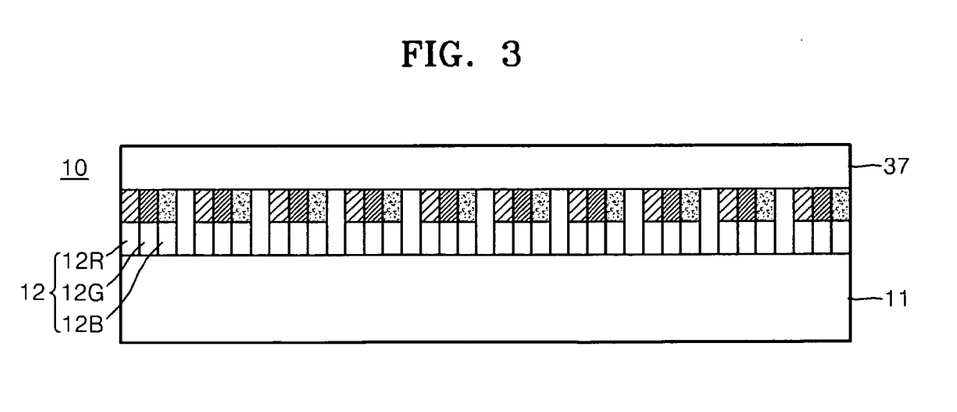
FIG. 3 is a schematic cross-sectional view of an overall structure for realizing a color image in a display apparatus that uses an oxide diode according to example embodiments.

FIG. 3 is a schematic cross-sectional view of an overall structure for realizing a color image in a display apparatus 10 that uses an oxide diode according to example embodiments. Referring to FIG. 3, display apparatus 10 may have a plurality of pixels 12 for realizing an image. Each of the pixels 12 may be formed on the substrate 11, and may include, for example, a red sub-pixel 12R that emits red color, a green sub-pixel 12G that emits green color, and a blue sub-pixel 12B that emits blue color. Also, each of the sub-pixels may include one thin film transistor (see FIG. 1) and one light emitting layer (see FIG. 1) described above. If the nano-rod diodes 34 in the light emitting layer 30 emits UV ray region light like the ZnO group material, the red sub-pixel 12R may include a red phosphor layer that transforms the UV ray region light to red light. In the same manner, the green sub-pixel 12G may include a green phosphor layer that transforms the UV ray region light to green light, and the blue sub-pixel 12B may include a blue phosphor layer that transforms the UV ray region light to blue light. A transparent substrate 37 may be formed on the plurality of pixels 12. When the method described above is adopted, the structures of the sub-pixels may be the same or different from each other in the light emitting layer 30, and the method of manufacturing the display apparatus 10 according to example embodiments may be simplified.

While example embodiments have been particularly shown and described with reference to example embodiments thereof, it will be understood by those skilled in the art that various changes in form and details may be made therein without departing from the spirit and scope of example embodiments as defined by the appended claims. Example embodiments should be considered in descriptive sense only and not for purposes of limitation. Therefore, the scope of example embodiments may be defined not by the detailed description of example embodiments but by the appended claims, and all differences within the scope will be construed as being included in example embodiments.

What is claimed is:

1. A display apparatus comprising:
   a substrate;
   a thin film transistor layer on the substrate; and
   a light emitting layer on the thin film transistor layer,
   wherein the light emitting layer includes:
      a plug metal layer on the thin film transistor layer;
      a plurality of nano-rod diodes substantially vertically erected on the plug metal layer, the plurality of nano-rod diodes being spaced apart from each other; and
      a transparent electrode on the plurality of nano-rod diodes,
   wherein each of the plurality of nano-rod diodes includes a lower layer portion doped with a first type dopant, an upper layer portion doped with a second type dopant which is opposite to the first type, and a non-doped region between the lower layer portion and the upper layer portion, and
   wherein the lower and upper layer portions of the nano-rod diode are formed of a doped ZnO group or a doped MgZnO group material, and the non-doped region of the nano-rod diode is formed of a non-doped ZnO group material.

2. The display apparatus of claim 1, wherein the lower layer portion of the nano-rod diode is formed of an n-type ZnO group or n-type MgZnO group material, and the upper layer portion of the nano-rod diode is formed of a p-type ZnO group or p-type MgZnO group material.

3. The display apparatus of claim 1, wherein the light emitting layer further comprises:
   a reflection layer for reflecting light emitted from the nano-rod diodes on an upper surface of the plug metal layer between the nano-rod diodes.

4. The display apparatus of claim 3, wherein the reflection layer is formed as a single metal layer.

5. The display apparatus of claim 4, wherein the reflection layer is formed of Al or an alloy containing Al.

6. The display apparatus of claim 3, wherein the reflection layer has a multilayer structure where two materials having different refractive indexes from each other are alternately stacked.

7. The display apparatus of claim 6, wherein the reflection layer has a multilayer structure in which Al and $MgF_2$ are alternately stacked.

8. The display apparatus of claim 3, further comprising:
an insulating layer on an upper surface of the reflection layer and between the nano-rod diodes.

9. The display apparatus of claim 8, wherein the plurality of nano-rod diodes emit ultraviolet (UV) ray region light.

10. A display apparatus comprising:
a plug metal layer;
a plurality of nano-rod diodes substantially vertically erected on the plug metal layer, the plurality of nano-rod diodes being spaced apart from each other;
a reflection layer for reflecting light emitted from the plurality of nano-rod diodes on an upper surface of the plug metal layer between the plurality of nano-rod diodes;
an insulating layer on an upper surface of the reflection layer and between the plurality of nano-rod diodes;
a transparent electrode on the insulating layer and on the plurality of nano-rod diodes; and
a phosphor layer on the transparent electrode,
wherein the plurality of nano-rod diodes emit ultraviolet (UV) ray region light and
the phosphor layer transforms the UV ray region light emitted from the plurality of nano-rod diodes into visible light region light.

11. The display apparatus of claim 10, further comprising:
a transparent substrate on an upper surface of the phosphor layer.

12. The display apparatus of claim 10, wherein the display apparatus includes a plurality of pixels for displaying an image, and each of the pixels includes three sub-pixels.

13. The display apparatus of claim 12, wherein the phosphor layer in each of the three sub-pixels includes one of a red phosphor layer that transforms the UV ray region light into red color, a green phosphor layer that transforms the UV ray region light into green color, and a blue phosphor layer that transforms the UV ray region light into blue color.

14. The display apparatus of claim 1, wherein the plug metal layer is formed of Au or an alloy containing Au.

15. A display apparatus comprising:
a plug metal layer;
a plurality of nano-rod diodes substantially vertically erected on the plug metal layer, the plurality of nano-rod diodes being spaced apart from each other;
a transparent electrode on the plurality of nano-rod diodes; and
a reflection layer for reflecting light emitted from the plurality of nano-rod diodes on an upper surface of the plug metal layer between the plurality of nano-rod diodes,
wherein lower surfaces of the plurality of nano-rod diodes are in direct contact with the plug metal layer, and the reflection layer is in contact with side surfaces of the plurality of nano-rod diodes.

* * * * *